United States Patent
Takagiwa

(10) Patent No.: US 8,238,172 B2
(45) Date of Patent: Aug. 7, 2012

(54) SEMICONDUCTOR MEMORY DEVICE AND METHOD FOR CONTROLLING THE SAME

(75) Inventor: Teruo Takagiwa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 12/884,951

(22) Filed: Sep. 17, 2010

(65) Prior Publication Data

US 2011/0141823 A1 Jun. 16, 2011

(30) Foreign Application Priority Data

Dec. 11, 2009 (JP) ................................. 2009-282108

(51) Int. Cl.
*G11C 7/10* (2006.01)
(52) U.S. Cl. ............... 365/189.05; 365/230.08; 365/200
(58) Field of Classification Search ............. 365/189.05, 365/230.08, 200
See application file for complete search history.

(56) References Cited

U.S. PATENT DOCUMENTS 7,224,605 B1 * 5/2007 Moogat et al. ........... 365/185.09

FOREIGN PATENT DOCUMENTS

| JP | 6-12892 | 1/1994 |
|---|---|---|
| JP | 2001-52496 | 2/2001 |
| JP | 2009-99186 | 5/2009 |
| KR | 2003-0061877 | 7/2003 |

OTHER PUBLICATIONS

Notification for Filing Opinion issued Oct. 25, 2011 in Korean Patent Application No. 10-2010-85306 (with English translation).

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

According to one embodiment, a semiconductor memory device includes a memory cell array, and first to third latch circuits. The first latch circuits hold information as to whether an associated column is defective. A pointer is set in the second latch circuits. The third latch circuits hold write data or read data. One of the third latch circuits is activated at a time the pointer is set to an associated second latch circuit when an associated first latch circuit holds the information indicating that the associated column is not defective. The pointer is sequentially shifted among the second latch circuits in synchronization with a clock. In shifting the pointer, the pointer skips one of the second latch circuits associated with one of the first latch circuit which holds the information indicating that the associated column is defective.

16 Claims, 11 Drawing Sheets

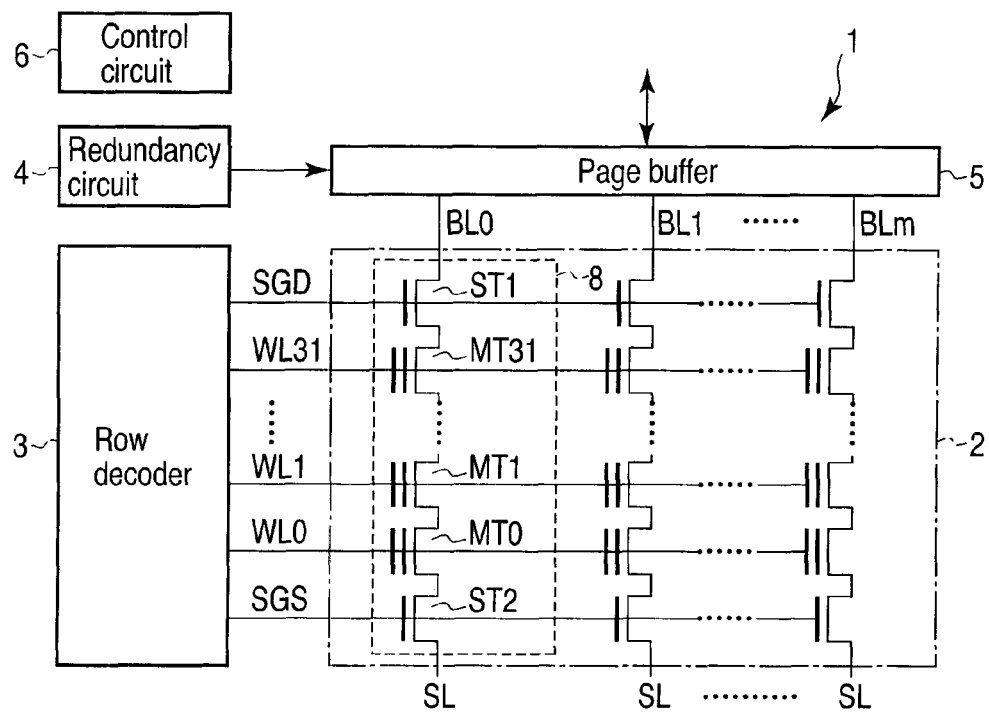
F I G. 1
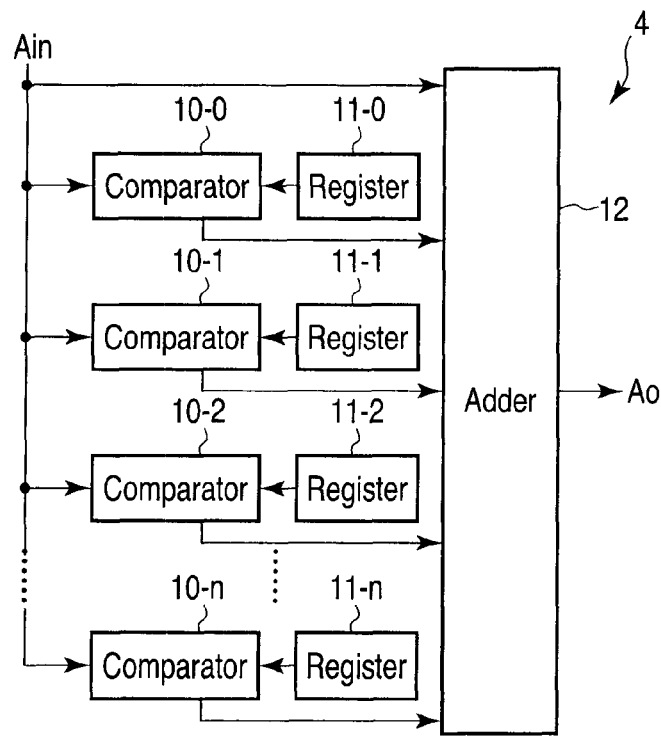
F I G. 2

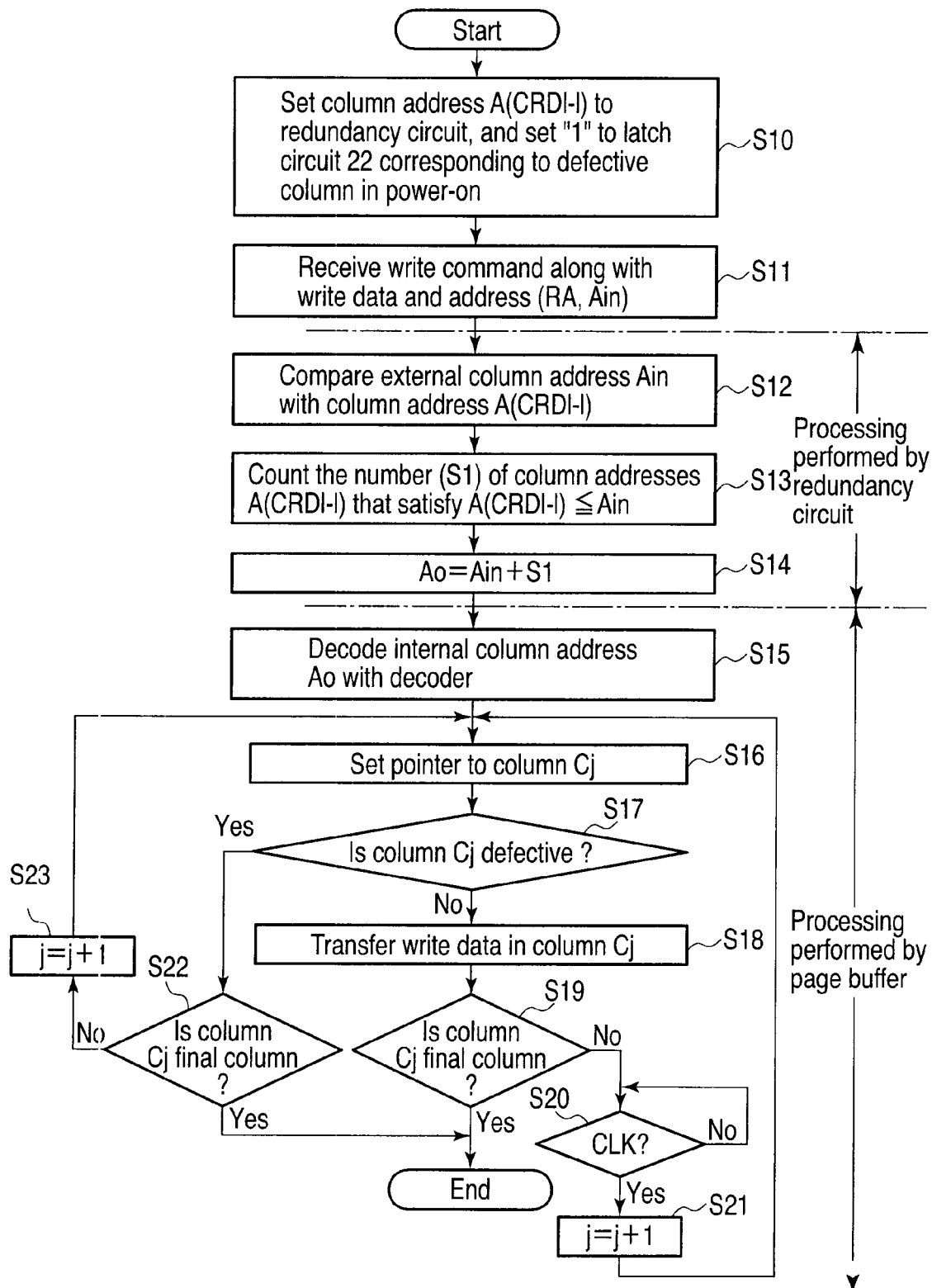
F I G. 4

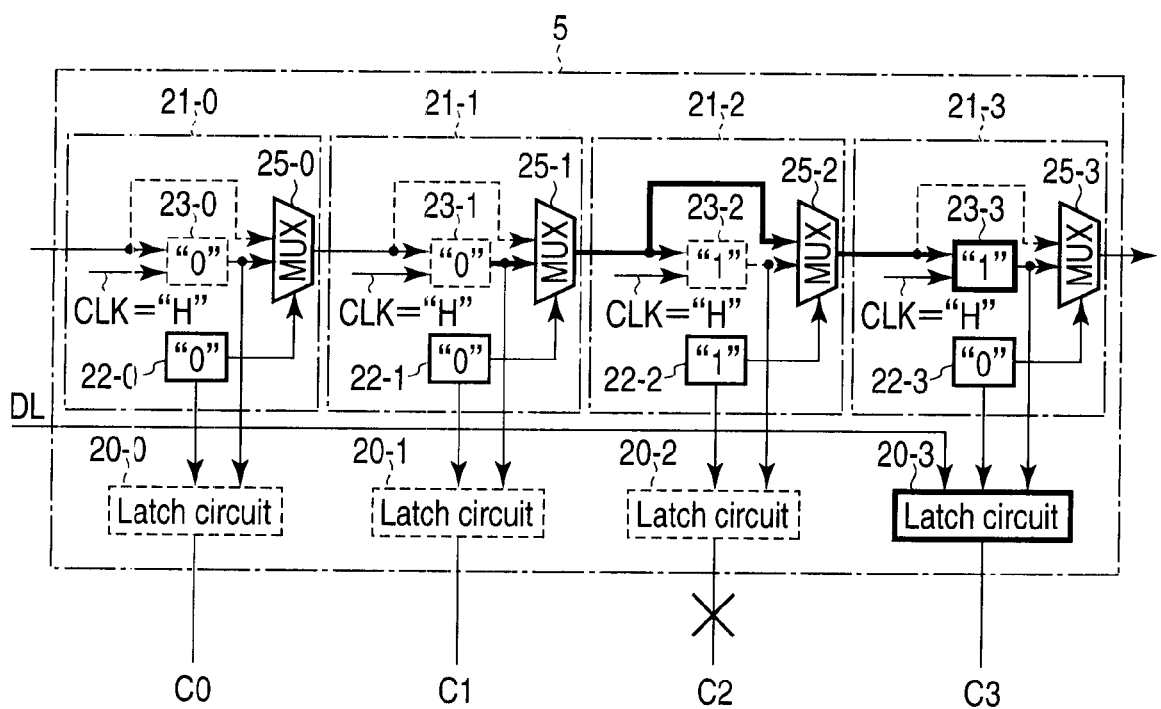
F I G. 8

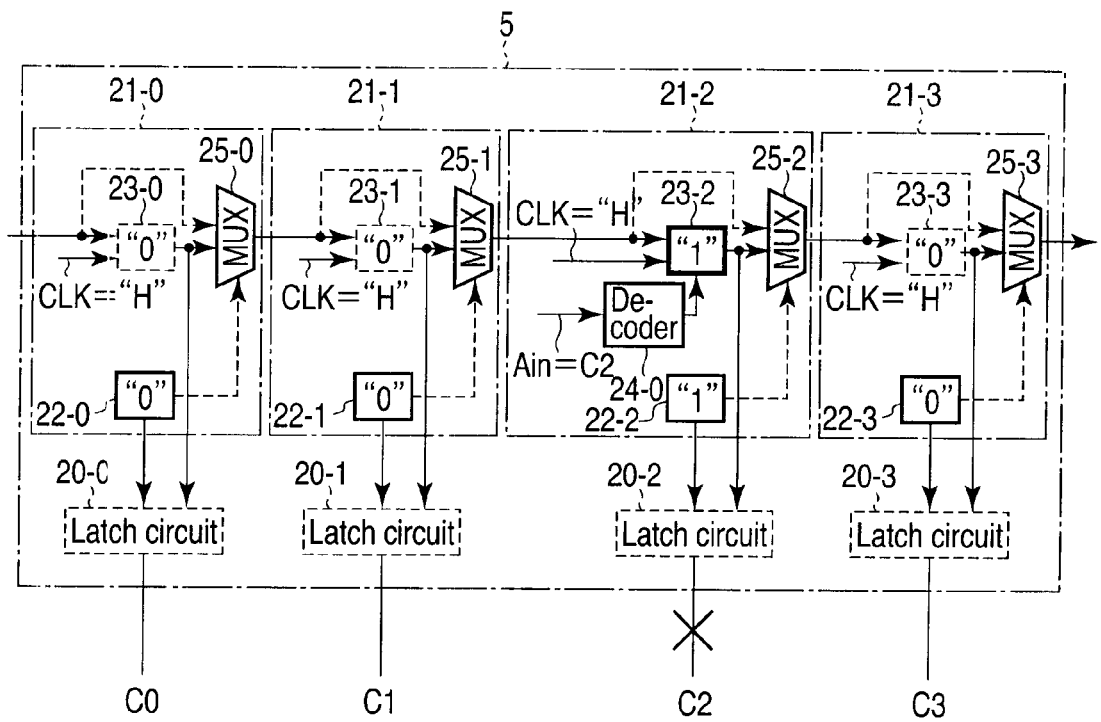
F I G. 14
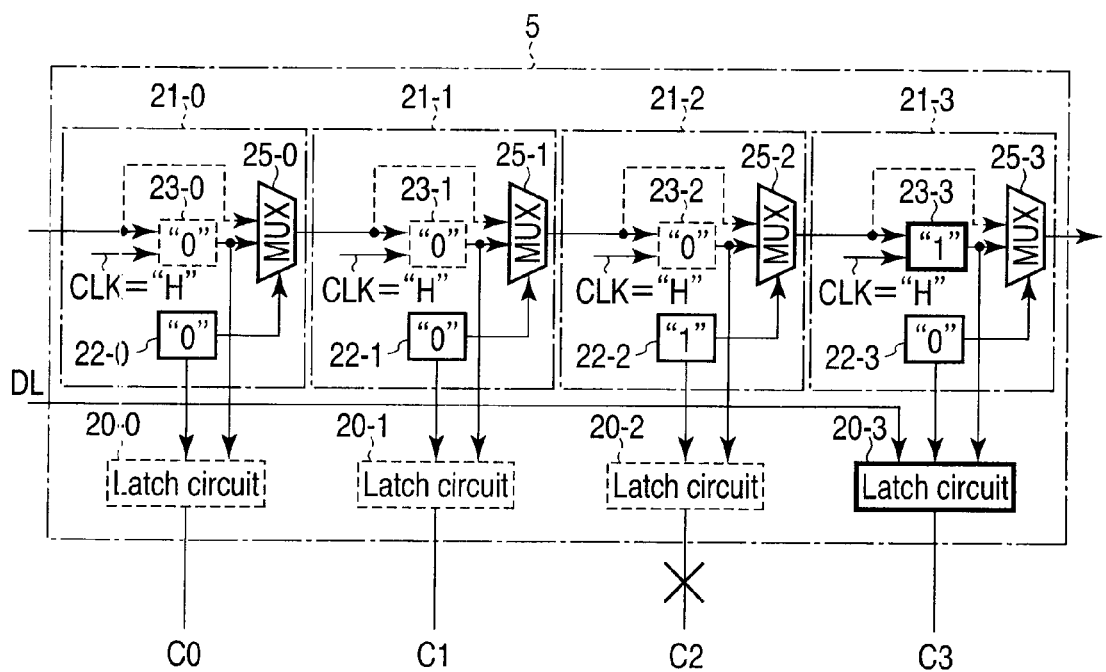
F I G. 15

SEMICONDUCTOR MEMORY DEVICE AND METHOD FOR CONTROLLING THE SAME

CROSS-REFERENCE TO RELATED APPLICATIONS

This application is based upon and claims the benefit of priority from Japanese Patent Application No. 2009-282108, filed Dec. 11, 2009; the entire contents of which are incorporated herein by reference.

FIELD

Embodiments described herein relate generally to a semiconductor memory device and a method for controlling the same. For example, the embodiments relate to a NAND flash memory having a function of replacing a defective column.

BACKGROUND

Conventionally, a technique (referred to as redundancy technique) of replacing a defective column with a redundancy column is widely used in the NAND flash memory. Therefore, the defective column can be repaired.

However, as a result of the use of the redundancy technique, a data write speed is degraded as increasing size of one page that is a unit in which the data is collectively written. For example, the problem is disclosed in Jpn. Pat. Appln. KOKAI Publication No. 6-12892. This is attributed to the fact that, because the redundancy column is usually provided at an end of the page, movement of the data is required in a page buffer when the data is transferred to the page buffer. Further, occasionally a circuit block that controls the replacement of the defective column with the redundancy column is enlarged to increase a chip size.

BRIEF DESCRIPTION OF THE DRAWINGS

FIG. 1 is a block diagram of a NAND flash memory according to a first embodiment;
FIG. 2 is a circuit diagram of a redundancy circuit according to the first embodiment;
FIG. 4 is a flowchart illustrating operation of the NAND flash memory according to the first embodiment;
FIGS. 6, 7, and 8 are circuit diagrams of the page buffer according to the first embodiment;
FIGS. 14 and 15 are circuit diagrams of the page buffer according to the second embodiment.

DETAILED DESCRIPTION

Figure 3:
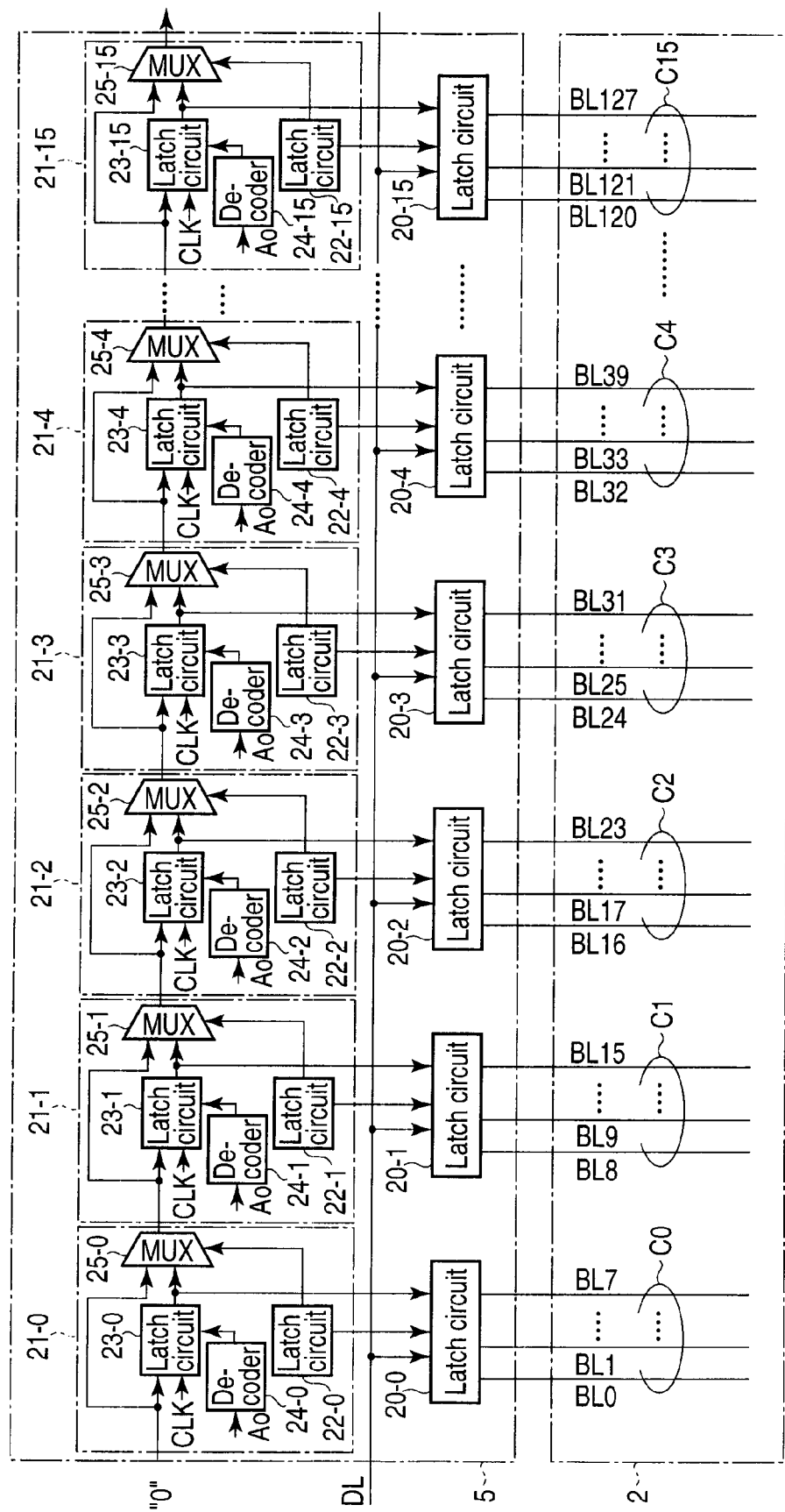
FIG. 3 is a circuit diagram of a page buffer according to the first embodiment.

In general, according to one embodiment, a semiconductor memory device includes: a memory cell array; and first to third latch circuits. The memory cell array includes memory cells associated with columns and capable of storing data. The first latch circuits are associated with the columns and hold information as to whether an associated column is defective. A pointer is set to the second latch circuits. The second latch circuits are associated with the columns. The third latch circuits are associated with the columns and hold write data or read data for an associated column. One of the third latch circuits is activated at a time the pointer is set to an associated one of the second latch circuits when an associated one of the first latch circuits holds the information indicating that the associated column is not defective. The pointer is sequentially shifted among the second latch circuits in synchronization with a clock. In shifting the pointer, the pointer skips one of the second latch circuits associated with one of the first latch circuits which holds the information indicating that the associated column is defective.

First Embodiment

A semiconductor memory device according to a first embodiment will be described by taking a NAND flash memory as an example.

<Entire Configuration of NAND Flash Memory>

FIG. 1 is a block diagram of a NAND flash memory of the first embodiment. Referring to FIG. 1, a NAND flash memory 1 includes a memory cell array 2, a row decoder 3, a redundancy circuit 4, a page buffer 5, and a control circuit 6.

The memory cell array 2 will be described. As illustrated in FIG. 1, the memory cell array 2 includes a plurality of NAND cells 8. Each of the NAND cells 8 includes a plurality of (in the example of FIG. 1, 32) memory cell transistors MT0 to MT31 and selection transistors ST1 and ST2. Hereinafter the memory cell transistors MT0 to MT31 are collectively referred to as a memory cell transistor MT when not distinguished from one another. The memory cell transistor MT has a stacked gate structure including a charge accumulation layer (for example, floating gate) that is formed on a semiconductor substrate with a gate insulating film interposed therebetween and a control gate that is formed on the charge accumulation layer with an inter-gate insulating film interposed therebetween. The charge accumulation layer may be made of an insulating material. A source and a drain are shared by the memory cell transistors MT adjacent to each other. The memory cell transistors MT are disposed between the selection transistors ST1 and ST2 such that current passes of the memory cell transistors MT are connected in series. The drain of one end side of the series-connected memory cell transistors MT is connected to the source of the selection transistor ST1, and the source on the other end side is connected to the drain of the selection transistor ST2.

The control gates of the memory cell transistors MT located in the same row are commonly connected to one of word lines WL0 to WL31, and the gates of the selection transistors ST1 and ST2 located in the same row are commonly connected to selection gate lines SGD and SGS, respectively. Hereinafter occasionally the word lines WL0 to WL31 are simply referred to as a word line WL. The drain of the selection transistor ST1 is connected to one of bit lines BL0 to BLm (m is a natural number of 2 or more), and the sources of the selection transistors ST2 are commonly connected to a source line SL. The bit lines BL0 to BLm are also simply referred to as a bit line BL when not distinguished from one another.

A unit called a block is formed by the NAND cells 8 in which the word line WL and the selection gate lines SGD and SGS are commonly used. The data is collectively erased in the memory cell transistors MT in the same block. The data is collectively written in the memory cell transistors MT connected to the same word line WL, and the unit is called a page. Although only one block is illustrated in FIG. 1, the plurality of blocks may be provided in a direction along the bit line BL. In such cases, the NAND cells 8 located in the same column in the memory cell 2 are commonly connected to the same bit line BL.

Then the row decoder 3 will be described. The row decoder 3 selects a row direction of the memory cell array 2. That is, the row decoder 3 selects the word line WL. The row decoder 3 applies a proper voltage to the selected word line WL and the non-selected word line WL.

In writing the data, the page buffer 5 temporarily holds the write data provided from an external host device (not illustrated) such as a personal computer and a digital camera, and transfers the write data to the bit line BL to collectively write the data in units of page. In reading the data, the page buffer 5 senses and amplifies the data read to the bit lines BL in units of page, and temporarily holds the data and outputs the data to the outside.

The redundancy circuit 4 controls the page buffer 5 to perform the replacement of the defective column. The redundancy circuit 4 and the page buffer 5 will be described in detail later. The term of "column" means a set of the bit lines BL, and the column will be also described in detail later.

The control circuit 6 controls the operation of the whole NAND flash memory 1. That is, the control circuit 6 controls the operations of the row decoder 3, the redundancy circuit 4, and the page buffer 5 in writing, reading, and erasing the data.

<Details of Redundancy Circuit 4>

The redundancy circuit 4 will be described in detail with reference to FIG. 2. FIG. 2 is a block diagram of the redundancy circuit 4.

Referring to FIG. 2, the redundancy circuit 4 includes (n+1) comparators 10-1 to 10-$n$, (n+1) registers 11-0 to 11-$n$, and an adder 12. (n+1) is a natural number of 1 or more.

The registers 11-0 to 11-$n$ hold information corresponding to addresses of defective columns CRD in the memory cell array 2. More specifically, the addresses of the defective columns CRD are associated with the registers 11-0 to 11-$n$ in the ascending order. Hereinafter the defective column CRD associated with the register 11-$l$ (l is a variable of 0 to n) is referred to as CRDl. The register 11-$l$ holds the column address corresponding to the column (CRD1-$l$). Hereinafter the column address is referred to as A(CRD1-$l$).

The comparators 10-1 to 10-$n$ are provided while associated with the registers 11-0 to 11-$n$, respectively. The comparator 10-$l$ compares the column address A(CRD1-$l$) held in the register 11-$l$ with a column address (referred to as an external column address Ain), which is input from the host device and indicates access target column of the host device. The comparator 10-$l$ outputs the comparison result to the adder 12. Hereinafter, the comparators 10-1 to 10-$n$ and the registers 11-0 to 11-$n$ are collectively referred to as a comparator 10 and a register 11 when not distinguished from one another, respectively.

The adder 12 counts the number of comparators 10 in which the column address A(CRD1-$l$) is equal to or lower than the external column address Ain (that is, A(CRD1-$l$)≦Ain). The count number is referred to as S1.

The adder 12 adds S1 to the external column address Ain and outputs the result as an internal column address Ao to the page buffer 5.

<Details of Page Buffer 5 and Memory Cell Array 2>

The page buffer 5 and the memory cell array 2 will be described in detail with reference to FIG. 3. FIG. 3 is a block diagram of the page buffer 5 and the memory cell array 2.

The memory cell array 2 will be described first. The memory cell array 2 includes 128 (m=127) bit lines BL. For the purpose of convenience, the number of bit lines BL is set to 128. Obviously the number of bit lines BL is not limited to 128, and an actual product usually includes 128 or more bit lines BL. The eight adjacent bit lines BL from the bit line BL0 form a unit of one column. In the first embodiment, because the 128 bit lines BL are included, 16 columns C0 to C15 are included. The bit lines BL8$i$ to BL(8$i$+7) belong to the column Ci (i is an integer of 0 to 15). Hereinafter the columns C0 to C15 are simply referred to as a column C when not distinguished from one another.

The page buffer 5 will be described. The page buffer 5 includes a plurality of latch circuits 20-0 to 20-15 and a plurality of selectors 21-0 to 21-15. The latch circuits 20-0 to 20-15 and the selectors 21-0 to 21-15 are associated with the columns C0 to C15, respectively. Hereinafter, occasionally the latch circuits 20-0 to 20-15 and the selectors 21-0 to 21-15 are collectively referred to as a latch circuit 20 and a selector 21 when not distinguished from one another, respectively.

The latch circuit 20-$i$ is associated with the column Ci, that is, the bit lines BL8$i$ to BL(8$i$+7) and has a function of holding the data. In reading the data, the latch circuit 20-$i$ temporarily holds the data read to the bit lines BL8$i$ to BL(8$i$+7). The latch circuit 20-$i$ outputs the read data to a data line DL. In writing the data, the latch circuit 20-$i$ temporarily holds the write data provided from the data line DL and transfers the write data to the bit lines BL8$i$ to BL(8$i$+7).

The selector 21 will be described. The selector 21-$i$ is associated with the latch circuit 20-$i$, that is, the column Ci and has a function of activating the associated latch circuit 20-$i$. The latch circuit 20-$i$ is activated by the associated selector 21-$i$, which allows the data to be input and output.

The selectors 21-0 to 21-15 include latch circuits 22-0 to 22-15 and 23-0 to 23-15, decoders 24-0 to 24-15, and selection circuits 25-0 to 25-15. Occasionally the latch circuits 22-0 to 22-15 and 23-0 to 23-15, decoders 24-0 to 24-15, and selection circuits 25-0 to 25-15 are referred to as latch circuits 22 and 23, a decoder 24, and a selection circuit 25 when not distinguished from one another, respectively.

The latch circuit 22-$i$ can hold information as to whether the associated column Ci is defective. That is, the latch circuit 22 is a so-called isolation latch. For example, the latch circuit 22 holds "1" when the associated column Ci is defective, and holds "0" when the associated column Ci is normal.

The latch circuit 23-$i$ can hold the pointer (for example, "1" data) that determines the time the associated latch circuit 20-$i$ is activated. For example, the latch circuit 23 captures input data in synchronization with a rising edge of a clock CLK. For example, the latch circuits 23 are collectively initialized by a control signal provided from the control circuit 6. The data held in all the latch circuits 23 become "0" by the initialization.

The decoder 24-$i$ decodes the internal column address Ao produced by the redundancy circuit 4. The pointer is forcedly set to the latch circuit 23-$i$ when the internal column address Ao indicates the corresponding column Ci. That is, the latch circuit 23-$i$ holds "1".

Based on the information held by the latch circuit 22-$i$, the selection circuit 25-$i$ selects one of the data held in the latch circuit 23-$i$ and the data input to the latch circuit 23-$i$ (that is, data output from the preceding selector 21-($i$−1)). More specifically, when "0" is held by the latch circuit 22-$i$, the selection circuit 25-$i$ selects and outputs the data held by the latch circuit 23-$i$. On the other hand, when "1" is held by the latch circuit 22-$i$, the selection circuit 25-$i$ selects and outputs the data input to the latch circuit 23-$i$.

In the above-described configuration, the selectors 21-0 to 21-15 are connected in series such that the output of the selector 21-$i$ is provided to the subsequent latch circuit 23-($i$+1) and selection circuit 25-($i$+1). "0" is input to the latch circuit 23-0 in the initial selector 21-0, and it is not necessary that the output of the selection circuit 25-15 in the final selector 21-15 be connected to anywhere. However, the output of the selection circuit 25-15 may be input to the control circuit 6.

The information ("1" or "0") held by the latch circuits 22-$i$ and 23-$i$ are provided to the latch circuit 20-$i$. The latch circuit 20-$i$ is activated, when the latch circuits 22-$i$ and 23-$i$ hold "0" and "1", respectively. The activated latch circuit 20-$i$ captures the write data in writing the data and outputs the read data in reading the data. The latch circuit 20-$i$ is not activated, when the latch circuit 22-$i$ holds "1" or when the latch circuit 23-$i$ holds "0".

<Data Transfer Operation During Write>

An operation (referred to as data transfer operation) in which the write data input from the host device is stored in the latch circuit 20 of the page buffer 5 in writing the data will be described with reference to FIG. 4. FIG. 4 is a flowchart of the data transfer operation.

In the data transfer operation, for example, when the NAND flash memory 1 is powered-on, the addresses of the defective columns CRD are read and allocated to the registers 11-0 to 11-$n$ in ascending order of the address. The column address A(CRD1-$l$) of the column (CRD1-$l$) is set to each register 11-$l$. In the page buffer 5, "1" is set to the latch circuit 22 associated with the defective column (Step S10). The processing in Step S10 may be performed by reading the defective column information from the memory cell array 2, or by a fuse element in which the defective column information is previously written. A write command is received from the host device along with the write data and the address (row address and external column address Ain) (Step S11).

The control circuit 6 executes a write sequence by receiving the write command, thereby starting the data transfer operation. The external column address Ain is input to the redundancy circuit 4. The comparator 10 of the redundancy circuit 4 compares the external column address Ain with the defective column address A(CRD1-$l$) in the associated register 11 (Step S12). The comparator 10 outputs the comparison result to the adder 12.

The adder 12 counts the number of column addresses A(CRD1-$l$) that satisfy Ain≧A(CRD1-$l$) in the comparator 10 (Step S13). The count number is referred to as S1. The adder 12 adds the external column address Ain and S1 and outputs the addition result (Ain+S1) as the internal column address Ao to the page buffer 5 (Step S14).

After Step S14, in the page buffer 5, the decoder 24 of each selector 21 decodes the internal column address Ao (Step S15). At this point, all the latch circuits 23 are initialized to hold "0". That is, the pointer is not set to any latch circuits 23. As described above, this is performed in the initialization operation by the control circuit 6.

As a result of Step S15, in one of the decoders 24, internal column address Ao is matched with the column C associated with the decoder 24. Therefore, the decoder 24 sets the pointer to the associated latch circuit 23 (Step S16). That is, "1" is set to the latch circuit 23. The column to which the pointer is set is referred to as column Cj (j=0 to 15).

If the column Cj is not defective, that is, when the latch circuit 22-$j$ of the selector 21-$j$ hold "0" (NO in Step S17), the latch circuit 23-$j$ holds "1" while the latch circuit 22-$j$ holds "0", thereby activating the correlated latch circuit 20-$j$. Therefore, the write data is transferred to the latch circuit 20-$j$ (Step S18).

When the column Cj is the final column, that is, in the case of j=15 (YES in Step S19), because the pointer is not set to any latch circuits 23, the data transfer operation is completed. For example, the control circuit 6 can recognize the completion of the data transfer operation by receiving the pointer ("1") output from the final selection circuit 25-15. Obviously the completion of the data transfer operation may be determined by another method. When the column Cj is not the final column (NO in Step S19), the flow synchronizes with the clock (YES in Step S20), and the flow returns to Step S16 while j is set to j+1. That is, the pointer is set to the next column Cj (Step S16).

When the column Cj is defective in step S16, that is, when the latch circuit 22-$j$ of the selector 21-$j$ holds "1" (YES in Step S17), the associated latch circuit 20-$j$ is not activated, and the write data is not transferred. When the column Cj is the final column (YES in Step S22), the data transfer operation is completed. On the other hand, when the column Cj is not the final column (NO in Step S22), the flow returns to Step S16 while j is set to j+1. That is, the pointer transferred from the column C(j−1) is transferred to the latch circuit 23-($j$+1) by the selection circuit 25-$j$ through a pass that skips the latch circuit 23-$j$.

When the data transfer operation is completed up to the latch circuit 20-15 associated with the final column C15, the data in the latch circuits 20 is transferred to the bit lines BL0 to BL127, and the data is written in the memory cell transistors MT.

Not only the determination whether the column Cj is the final column, but also the determination whether the write data yet to be transferred to the latch circuit 20 still remains may be made in Steps S19 and S22. That is, the data transfer operation may be completed at the time the write data to be transferred to the latch circuit 20 is eliminated.

<Specific Example of Data Transfer Operation>

A specific example of the data transfer operation will be described below.

First Example

The case where, in the four columns C0 to C3, the column C2 is defective while the external column address Ain corresponds to the column C0 will be described as a first example for the sake of convenience.

Figure 5:
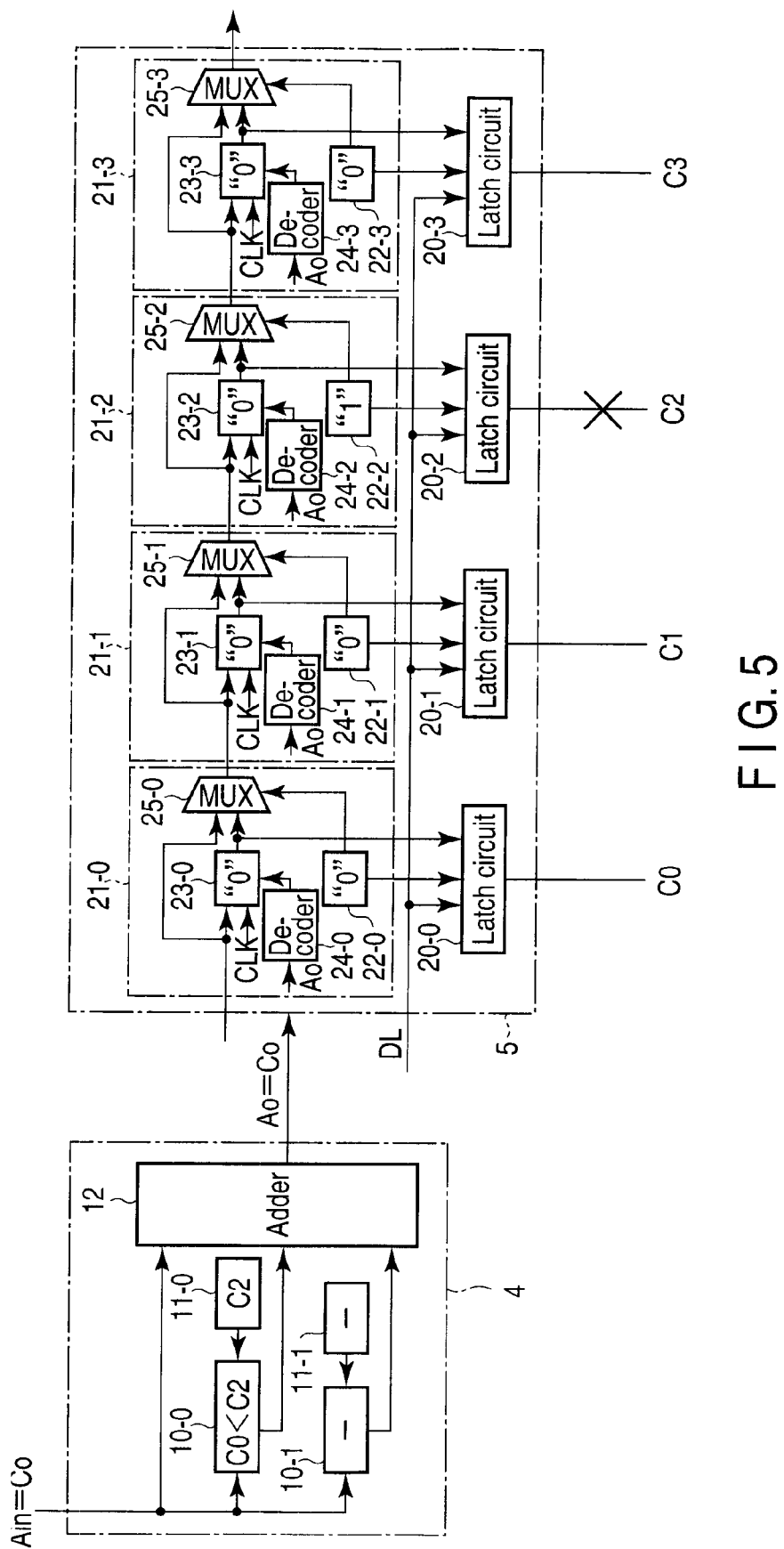
FIG. 5 is a circuit diagram of the redundancy circuit and the page buffer according to the first embodiment.

The processing in Steps S10 to S14 of FIG. 4 are performed. The operation corresponding to the processing in Steps S10 to S14 will be described with reference to FIG. 5. FIG. 5 is a block diagram of the redundancy circuit 4 and the page buffer 5.

The defective column is the column C2 and is associated with the register 11-0 of the redundancy circuit 4. That is, CRD0=C2. Accordingly, the register 11-0 holds the column address A(C2-0) corresponding to the column (C2-0)=C2. Obviously the column address is equal to the address of the column C2. Therefore, "0" is held in the latch circuits 22-0, 22-1, and 22-3 of the page buffer 5, and "1" is held in the latch circuit 22-2 associated with the defective column C2 (Step S10). All the latch circuits 23 are initialized in the state in which "0" is held.

Then the write command is received (Step S11). The external column address Ain provided from the host device is the address corresponding to the column C0. The comparator 10-0 of the redundancy circuit 4 compares the column address corresponding to the defective column C2 in the register 11 and the external column address Ain (Step S12). Because of C0<C2, the number of counts S1 in the adder 12 is "0" (Step S13). Accordingly, the adder 12 produces the address corresponding to the column C0 as the internal column address Ao and outputs the internal column address Ao to the page buffer 5 (Step S14).

Figure 6:
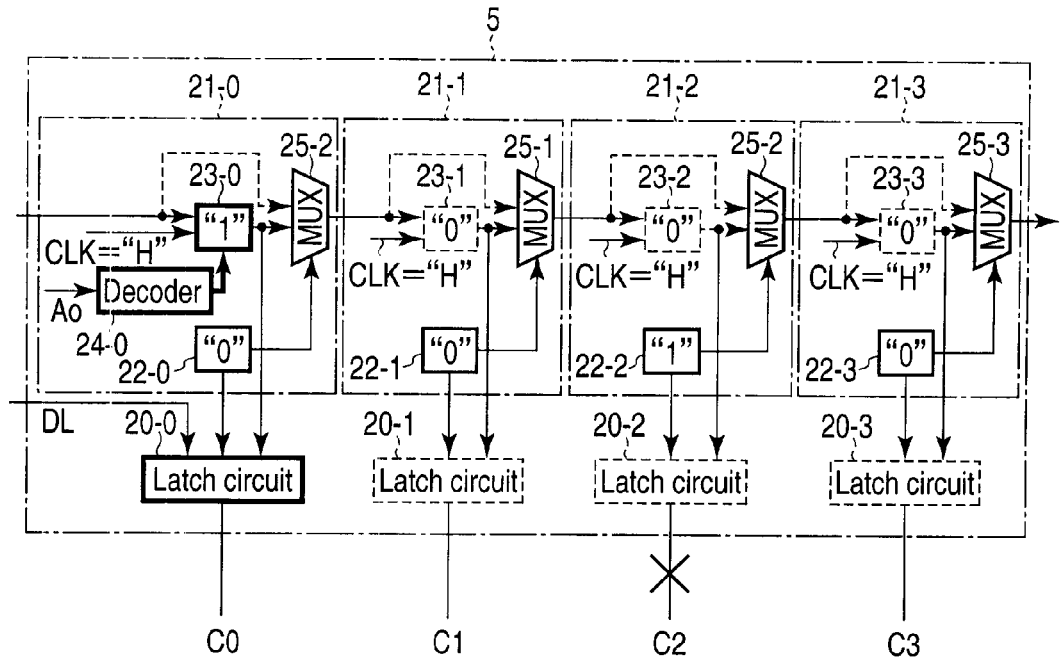
Figure 7:
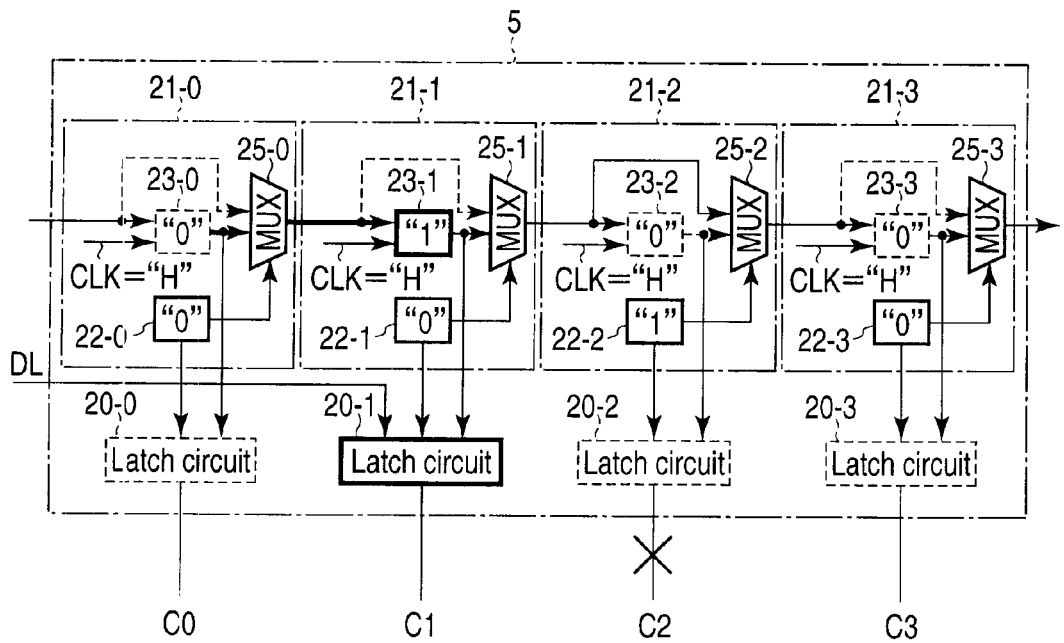

The subsequent operation of the page buffer 5 will be described with reference to FIGS. 6 to 8. FIGS. 6 to 8 are block diagrams of the page buffer 5 and illustrate the operation of the page buffer 5 that changes with the input of the clock CLK. In FIGS. 6 to 8, for the sake of easy understanding, the block that does not relate to the main operation is omitted, and the block and signal pass on which attention should be focused are indicated in bold line. A cross mark in the drawing means that a defect exists.

After Step S14, the decoders 24-0 to 24-3 decode the internal column address Ao (Step S15). Because the internal column address Ao indicates the column C0, the decoder 24-0 sets the pointer to the latch circuit 23-0 as illustrated in FIG. 6 (j=0 in Step S16). Therefore, the latch circuit 20-0 is activated because of the latch circuit 22-0="0" (NO in Step S17) and latch circuit 23-0="1" in the selector 21-0. The write data is transferred to the latch circuit 20-0 (Step S18).

When the clock CLK is input (YES in Step S20), as illustrated in FIG. 7, the pointer of the latch circuit 23-0 selected by the selection circuit 25-0 is captured by the latch circuit 23-1 (Steps S21 and S16). Because the latch circuit 22-1 holds "0" (NO in Step S17), the latch circuit 20-1 is activated. The write data is transferred to the latch circuit 20-1 (Step S18). At this point, for example, "0" is input to the first latch circuit 23-0 from the control circuit 6. Because the latch circuit 23-0 captures "0" along with the input of the clock CLK, the pointer set to the latch circuit 23-0 is cleared. That is, the latch circuit 20-0 is inactivated.

When the clock CLK is input (YES in Step S20), as illustrated in FIG. 8, the pointer of the latch circuit 23-1 selected by the selection circuit 25-1 is captured in the latch circuit 23-2 (Steps S21 and S16). However, because the latch circuit 22-2 holds "1" (YES in Step S17), the selection circuit 25-2 transfers the output ("1") of the selection circuit 25-1 to the latch circuit 23-3 through a bypass of the latch circuit 23-2 (Step S23). The pointer is set also to the latch circuit 23-3 (Step S16).

Because both the latch circuits 22-2 and 23-2 hold "1" in the selector 21-2, the latch circuit 20-2 is not activated. On the other hand, the latch circuit 20-3 is activated because of the latch circuit 22-3="0" and latch circuit 23-3="1" in the selector 21-3. Therefore, the write data is transferred to the latch circuit 20-3 (Step S18).

At the time of FIG. 8, "0" of the latch circuit 23-0 is captured in the latch circuit 23-1. Accordingly, the latch circuits 20-0 and 20-1 are also inactivated. Thus, the data transfer operation is completed (YES in Step S19).

In the first example, the external column address Ain corresponds to the column C0. The similar operation is performed when the external column address Ain corresponds to each of the columns C1 to C3. When the external column address Ain corresponds to the column C2, S1=1 is obtained, and the column indicated by the internal column address Ao becomes C2+1=C3. Therefore, in FIG. 6, the pointer is set to the latch circuit 23-3.

Second Example

Figure 9:
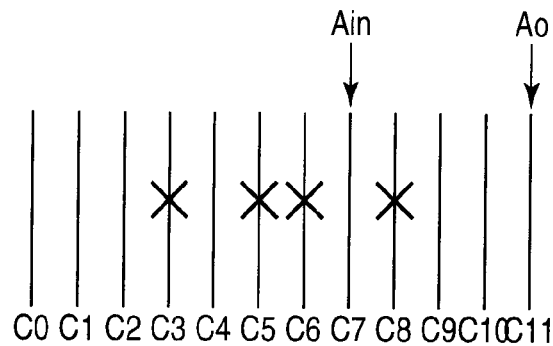
FIG. 9 is a schematic diagram of a column according to the first embodiment.

The operation of the redundancy circuit 4 will be described using another example. FIG. 9 is a schematic diagram of a column included in the memory cell array 2. As illustrated in FIG. 9, for the sake of convenience, it is assumed that, in the 12 columns C0 to C11, the columns C3, C5, C6, and C8 are defective. It is also assumed that the address corresponding to the column C7 is input as the external column address Ain.

Figure 10:
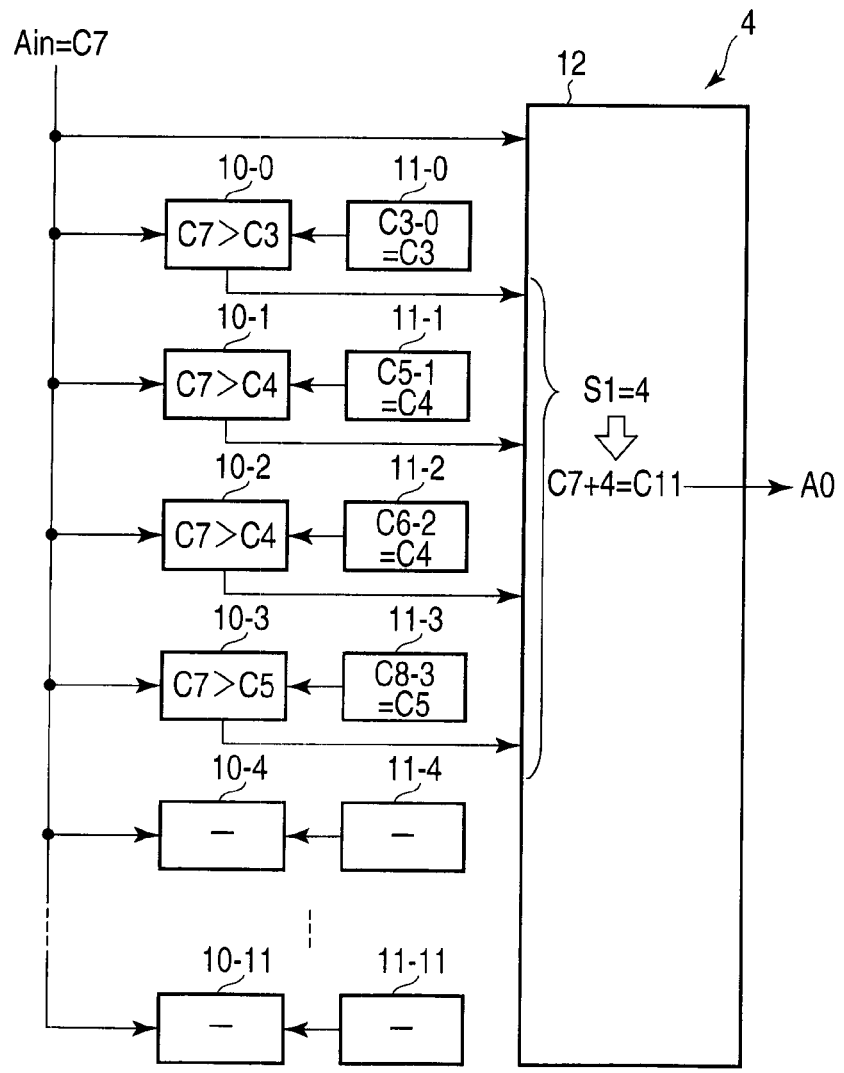
FIG. 10 is a circuit diagram of the redundancy circuit according to the first embodiment.

FIG. 10 is a block diagram of the redundancy circuit 4 in such cases. As illustrated in FIG. 10, in the registers 11-0 to 11-11, the registers 11-0 to 11-3 are associated with the defective columns C3, C5, C6, and C8. The register 11-0 holds the column address corresponding to (C3−0)=C3, the register 11-1 holds the column address corresponding to (C5−1)=C4, the register 11-2 holds the column address corresponding to (C6−2)=C4, and the register 11-3 holds the column address corresponding to (C8−3)=C5.

Because the column corresponding to the external column address Ain is column C7, A(CRD1-$l$)≦Ain holds in all the comparators 10-0 to 10-3. Therefore, S1=4 is obtained in the adder 12, and the internal column address Ao becomes the address corresponding to (C7+4)=C11. As a result, the pointer is set to the latch circuit 23 correlated with the column C11.

Effect of First Embodiment

According to the semiconductor memory device of the first embodiment, the operating speed can be enhanced while the increase in chip size is suppressed. The effect will be described below.

In the configurations of conventional column redundancy systems, generally, a normal column region and a redundancy column region are provided in a page buffer. When the memory cells are accessed, the normal column region is accessed using an internal column address. When the defective column address stored in the redundancy circuit is equal to the internal column address, an internal signal is produced in order to access the redundancy column region, thereby obtaining access to the redundancy column region. However, in the conventional configuration, an interconnection length of an internal address signal is increased, it is necessary to change the internal address signal each time in sequentially obtaining access to the columns, and a difference in interconnections of the internal address signal is generated because the normal column region and the redundancy column region are distant from each other, which causes a problem in that the operating speed of the data input/output is degraded.

Therefore, a configuration in which the pointer provided in each column is shifted is considered in order to enhance the data input/output speed. In the configuration, first the data is stored in the normal column region. Then the data in the defective column is sequentially transferred from the normal column region to the redundancy column region. However, in case of trouble with the normal column region, the data cannot be transferred to the redundancy column region, which causes a problem of chip defect.

Therefore, in a possible configuration, a data latch is provided in the redundancy circuit, and the write data is temporarily held in the data latch. In the configuration, when the normal column is accessed, the data is stored in the normal column region of the page buffer. However, when the defective column is accessed, first the data is stored in the data latch of the redundancy circuit. Then the defective column information is read in the redundancy circuit, and the data retained in the data latch of the redundancy circuit is sequentially transferred to the redundancy column region of the page buffer. In the configuration, because the data corresponding to the defective column is stored in the data latch of the redundancy circuit, the chip defect is not generated even if a trouble is generated in the normal column region of the page buffer. However, unfortunately a circuit scale of the redundancy circuit is considerably increased.

Figure 11:
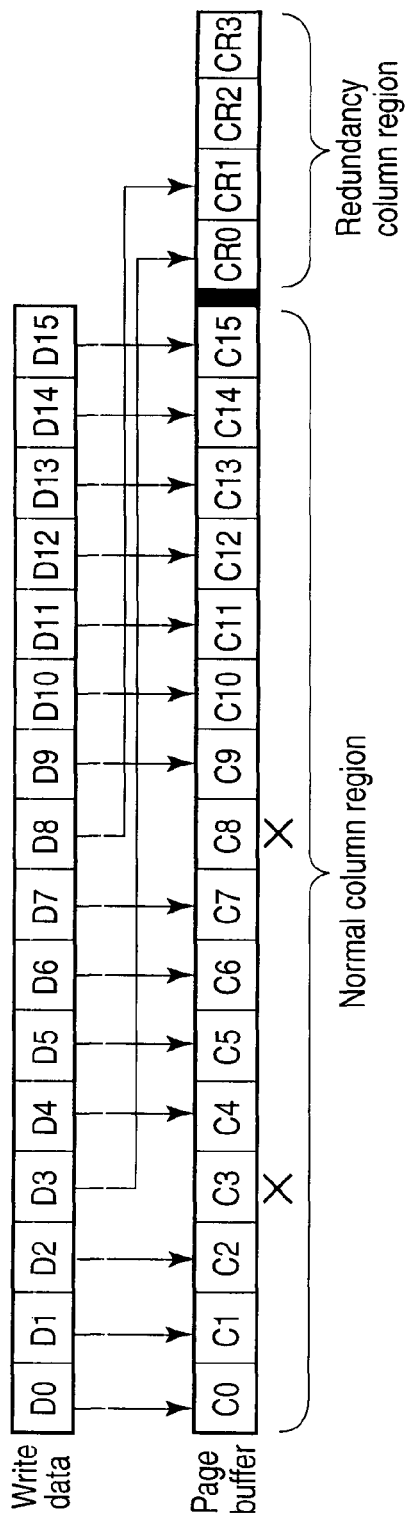
FIG. 11 is a schematic diagram of write data and the page buffer.

In each case, the page buffer is clearly divided into the normal column region and the redundancy column region. FIG. 11 illustrates a state in which the write data is transferred to the page buffer in the above case. FIG. 11 is a schematic diagram of the write data and the page buffer. In FIG. 11, it is assumed that the columns C3 and C8 are defective.

For example, it is assumed that data D0 to D15 is written in the columns C0 to C15, respectively. The data D0 to D2, D4 to D7, and D9 to D15 are set to the data latches corresponding to the columns C0 to C2, C4 to C7, and C9 to C15 in the page buffer. The data D3 and D9 are set to the data latches corresponding to redundancy columns CR0 and CR1 by one of the above-described methods. In any one of the above-described methods, it takes a long time to transfer the data to the redundancy column region, and a chip area is enlarged when the data transfer time is shortened.

On the other hand, in the configuration of the first embodiment, the problems are solved, and the data transfer speed can be enhanced while the increase in chip area is suppressed.

In the first embodiment, the latch circuit 22 is provided in each column, and holds the information as to whether the associated column is defective. When the latch circuit 22 holds the information indicating that the associated column is defective, the access to the associated latch circuit 20 is forcedly inhibited. The latch circuit 23 is provided in each column, and the pointer is held in the latch circuit 23. The pointer is shifted with the clock, and the pointer skips the latch circuit 23 associated with the defective column during the shift.

In the configuration of the first embodiment, when the external column address Ain is received from the host device, it is detected whether the defect exists in the column addresses from the external column address Ain. The number of defects S1 is determined by the following equation (1):

$$S_1 = \sum_{l=0}^{N-1} CRDl - l \le Ain \qquad (1)$$

where N is the number of redundancy columns (that is, the number of registers 11 of FIG. 2). CRDl is the defective column, and A(CRD0-0), A(CRD1-1), A(CRD2-2), . . . become the column addresses stored in the registers 11-0, 11-1, 11-2, . . . , respectively. As described above, in CRD0, CRD1, CRD2, . . . , the suffixes are provided to the defective columns CRD in ascending order of the address. That is, the A(CRD0-0), A(CRD1-1), A(CRD2-2), . . . are stored in the registers 11-0, 11-1, 11-2, . . . in ascending order of the address of the defective column CRD.

The internal column address Ao is calculated by (Ain+S1), and the pointer is set to the latch circuit 23 associated with the internal column address Ao. That is, Ao=Ain+S1 becomes the leading column address to be accessed. Then the pointer is shifted with the clock while skipping the latch circuit 23 associated with the defective column.

According to the configuration of the first embodiment, only the latch circuits 20 associated with the normal columns can sequentially be activated without reading the defective column information from the column redundancy circuit each time the accessing to the latch circuit 20.

Figure 12:
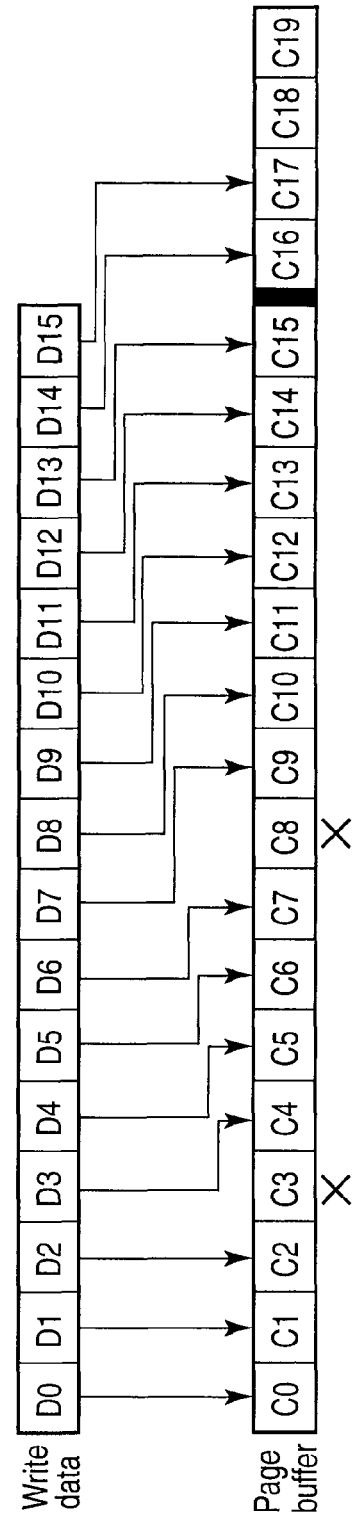
FIG. 12 is a schematic diagram of the write data and the page buffer according to the first embodiment.

FIG. 12 illustrates a state of the activation of the latch circuit 20 by the method of the first embodiment compared with the case of FIG. 11. FIG. 12 is a schematic diagram of the write data and the page buffer. In FIG. 12, it is assumed that the columns C3 and C8 are defective as in the case of FIG. 11.

As illustrated in FIG. 12, the column to which the write data is set is shifted by one each time the defective column exists in the pointer shift process. Because the column C3 is defective, the data D3 to D6 are set to the columns C4 to C7. Because the column C8 is defective, the data D7 to D15 are set to the columns C9 to C17. That is, the columns C16 to C19 are used not only to store the data associated with the defective column but also to compensate the column that runs short in the case of the defective column.

That is, the redundancy column region of FIG. 11 is not provided, and the access can always be obtained only to the normal column. Accordingly, the increased length of the interconnection used to activate the latch circuit 20 and the increased difference in interconnection length among the interconnections are suppressed. It is not necessary that the data be moved after the data is temporarily stored in one of data latches. Accordingly, the data input/output speed can be enhanced. Because the data is not stored in the latch circuit 20 corresponding to the defective column, the generation of the chip defect is eliminated even if the trouble is generated in one of the latch circuits 20.

The configuration of the first embodiment can be realized by the comparator 10 that calculates the equation (1), the adder 12 that adds the comparison result, and the latch circuits 22 and 23 that can retain one-bit information. Accordingly, the effect is obtained while the increase of circuit scale is suppressed.

Second Embodiment

A semiconductor memory device according to a second embodiment will be described below. In the second embodiment, after the pointer is set to the latch circuit 23 based on the external column address Ain in the first embodiment, the pointer is shifted to search for the leading column to be accessed. Only the point different from that of the first embodiment will be described below.

<Configuration of NAND Flash Memory 1>

In a NAND flash memory 1 of the second embodiment, the configuration of the first embodiment is changed as follows.

(i) An adder 12 of a redundancy circuit 4 counts the count number S1 and sends back the count number S1 to a control circuit 6, without calculating the internal column address Ao.

(ii) A decoder 24 decodes not the internal column address Ao but the external column address Ain, and sets the pointer to a latch circuit 23 based on the decode result.

(iii) The control circuit 6 shifts the pointer by the count number S1. In the shift operation, a selection circuit 21 always selects the output of the latch circuit 23. That is, the skip of the latch circuit 23 is not performed.

<Data Transfer Operation During Write>

Figure 13:
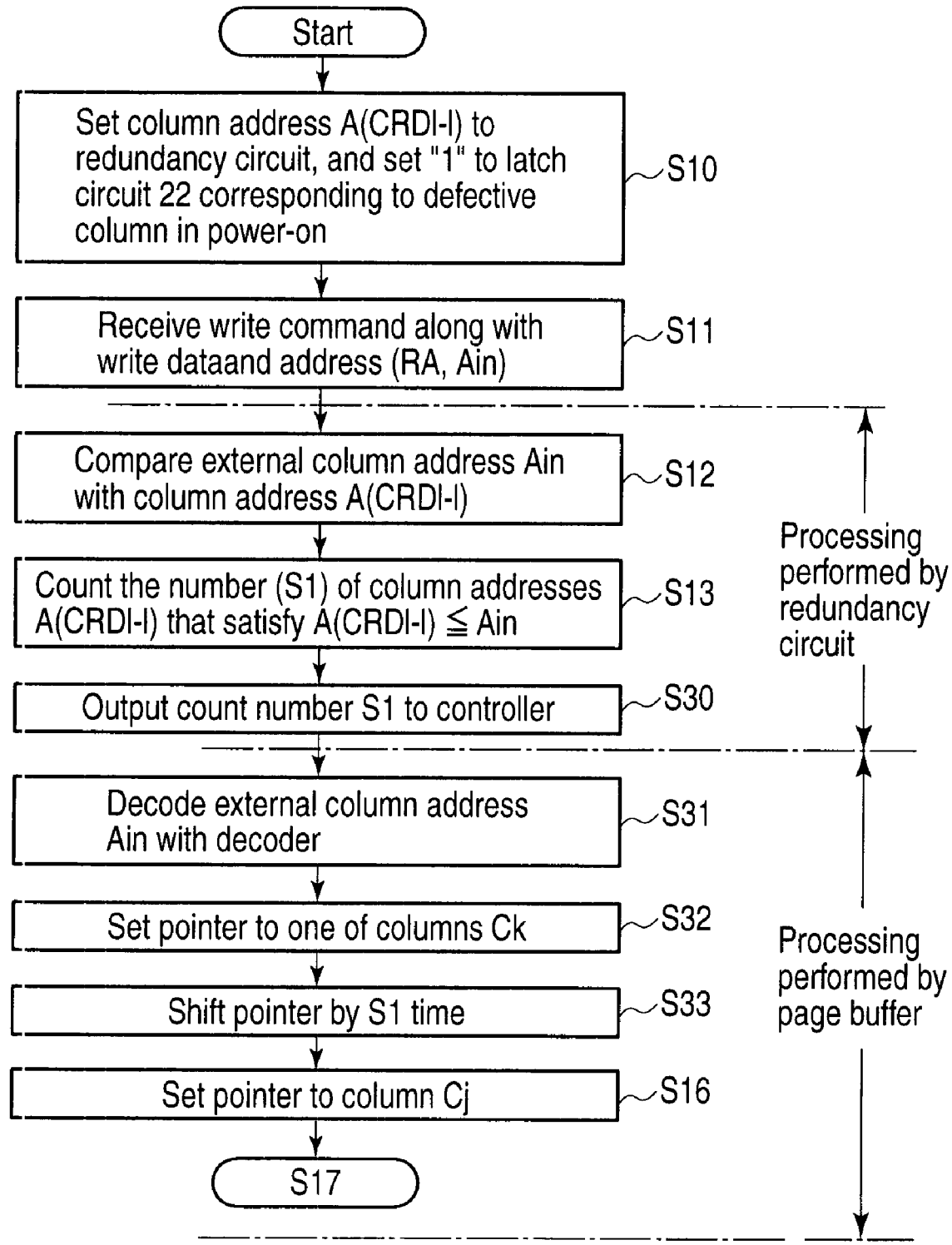
FIG. 13 is a flowchart illustrating operation of a NAND flash memory according to a second embodiment.

The data transfer operation of the second embodiment will be described with reference to FIG. 13. FIG. 13 is a flowchart of the data transfer operation of the second embodiment. The data transfer operation of the second embodiment differs from that of the first embodiment only in the method for determining the leading column to be accessed. Accordingly, the description is made while the attention is focused on this point.

The operations in Steps S10 to S13 of FIG. 4 of the first embodiment are performed. After Step S13, the adder 12 outputs the count number S1 to the control circuit 6 without calculating the internal column address Ao (Step S30).

In a page buffer 5, the decoder 24 decodes the external column address Ain. As a result, in one of the decoders 24, because the external column address Ain is matched with the column C associated with the decoder 24, the decoder 24 sets the pointer to the associated latch circuit 23 (Step S32). That is, "1" is set to the latch circuit 23. The column to which the pointer is set is referred to as a column Ck (k=0 to 15). Steps S31 and S32 may be performed before Steps S12 to S30, or Steps S31 and S32 and Steps S12 to S30 may concurrently be performed.

Then the control circuit 6 shifts the pointer by S1 times (Step S33). That is, the control circuit 6 inputs the clock CLK to the page buffer 5 S1 times. As a result, the pointer is set to the column Cj (Step S16). At this point, j=k+S1. Therefore, the leading column to be accessed is determined.

Then the operations from Step S17 of the first embodiment are performed. Step S16 is performed after Steps S21 and S23. In Step S33, the selection circuit 25 selects the output of the latch circuit 23 irrespective of the data in the latch circuit 22.

<Specific Example of Data Transfer Operation>

A specific example of the data transfer operation, particularly the method for determining the leading column will be described below with reference to FIGS. 14 and 15. FIGS. 14 and 15 are block diagrams of the page buffer 5. For the sake of convenience, similarly to FIGS. 6 to 8, it is assumed that, in the four columns C0 to C3, the column C2 is defective. It is also assumed that the external column address Ain corresponds to the defective column C2.

After Step S11, the decoders 24-0 to 24-3 decode external column address Ain (Step S31). Because the external column address Ain indicates the column C2, the decoder 24-2 sets the pointer to the latch circuit 23-2 as illustrated in FIG. 14 (k=2 in Step S32).

Then the control circuit 6 inputs the clock to the page buffer 5 S1 times (Step S33). In the second embodiment, the external column address Ain is the defective column C2, and the columns C0 and C1 are normal. Therefore, S1=1. Accordingly, the control circuit 6 inputs the clock only once. As a result, as illustrated in FIG. 15, the pointer ("1") is set to the latch circuit 23-3, and "0" is set to the latch circuit 23-2.

The subsequent operations are similar to those of FIGS. 7 and 8 of the first embodiment.

Effect of Second Embodiment

The effect similar to that of the first embodiment is obtained in the configuration of the second embodiment. In the configuration of the second embodiment, the calculation of the internal column address Ao is eliminated in the adder, so that the configuration of the redundancy circuit 4 can be simplified.

Third Embodiment

A semiconductor storage device according to a third embodiment will be described below. In the third embodiment, the pointer of the first embodiment is eliminated, and the internal column address Ao is produced each time the latch circuit 20 is accessed. Only the point different from that of the first embodiment will be described below.

<Configuration of NAND Flash Memory 1>

In a NAND flash memory 1 of the third embodiment, similarly to the first embodiment, a redundancy circuit 4 calculates the number of defects from the equation (1) and calculates the internal column address Ao using (Ain+S1). The internal column address Ao becomes the leading column to be accessed. For example, the redundancy circuit 4 re-calculates the internal column address Ao in synchronization with the clock CLK, and outputs the internal column address Ao to a page buffer 5. The internal column address Ao is produced so as to sequentially access the normal columns. The method for producing the internal column address Ao is described later.

Figure 16:
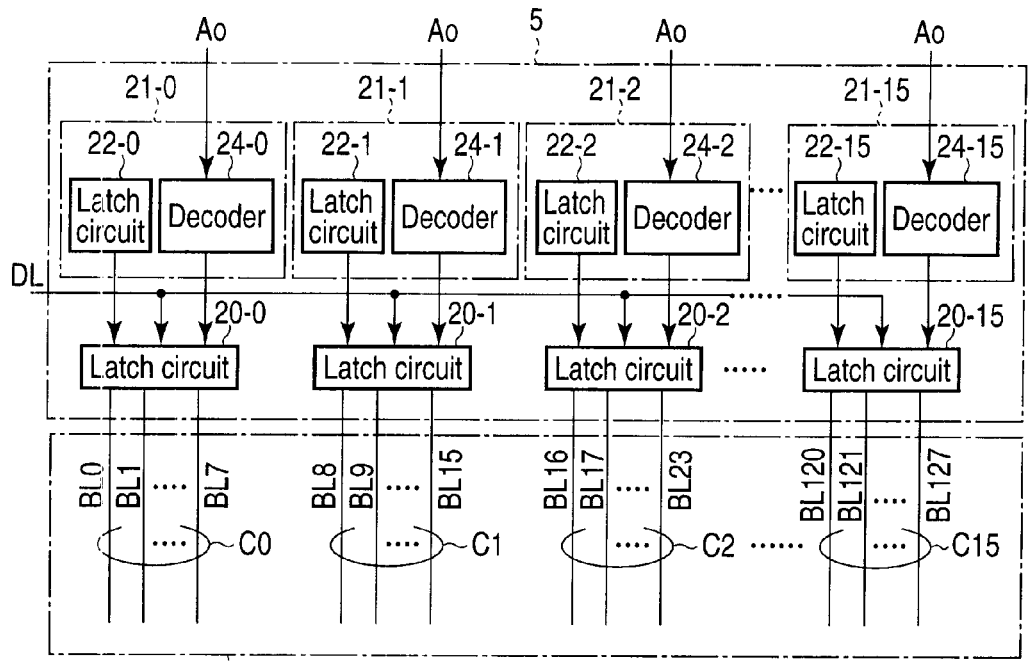
FIG. 16 is a circuit diagram of a page buffer according to a third embodiment.

The page buffer 5 of the third embodiment has a configuration of FIG. 16. FIG. 16 is a block diagram of the page buffer 5 of the third embodiment. As illustrated in FIG. 16, the page buffer 5 has the configuration in which the latch circuit 23 and the selection circuit 25 of the selector 21 are eliminated in the configuration of FIG. 3 of the first embodiment. A decoder 24 decodes the internal column address Ao, and the latch circuit 20 is activated based on the decode result and data in a latch circuit 22. More specifically, the latch circuit 20 is activated, when the internal column address Ao indicates the column correlated therewith as a result of decode while "0" is retained in the latch circuit 22.

<Data Transfer Operation During Write>

Figure 17:
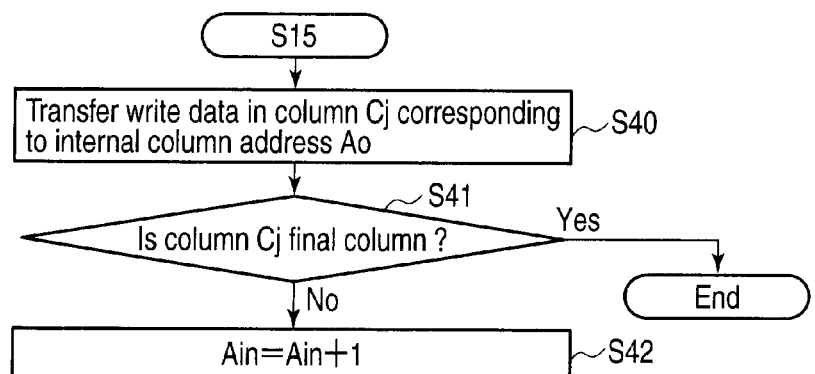
FIG. 17 is a flowchart illustrating operation of the NAND flash memory according to the third embodiment.

The data transfer operation of the third embodiment will be described with reference to FIG. 17. FIG. 17 is a flowchart of the data transfer operation of the third embodiment.

The processing in Steps S11 to S15 of FIG. 4 of the first embodiment is performed as illustrated in FIG. 17. As a result of Step S15, in the column Cj associated with the internal column address Ao, the latch circuit 20-j is activated, and the write data is transferred to the latch circuit 20-j (Step S40). When the column Cj is the final column C15 (YES in Step S41), the data transfer operation is completed.

When the column Cj is not the final column C15 (NO in Step S41), the next internal column address Ao is calculated in the redundancy circuit 4. That is, the adder 12 adds "1" to the current external column address Ain to form the external column address Ain (Step S42), and the flow returns to Step S12 to calculate the internal column address Ao. "Adding "1"" means that the target column C is shifted by "1".

Effect of Third Embodiment

In the configuration of the third embodiment, the data transfer speed can be enhanced while the increase in chip area is suppressed. That is, the internal column address calculating method of the first embodiment is effectively applied to the column redundancy system without pointer.

In the third embodiment, the column address to be accessed is always compared to the defective column in the register 11. The address of the normal column is sequentially issued.

Figure 18:
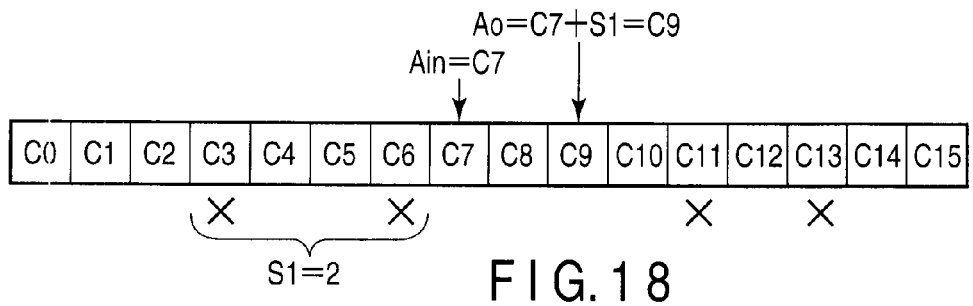
FIG. 18 is a schematic diagram of the page buffer according to the third embodiment.

FIG. 18 illustrates this state. FIG. 18 is a schematic diagram of the page buffer 5, and illustrates the state in which the columns C3, C6, C11, and C13 are defective. In this case, the column address of the column C3(=C3−0) is retained in the register 11-0, the column address of the column C5(=C6−1) is retained in the register 11-1, the column address of the column C9(=C11−2) is retained in the register 11-2, and the column address of the column C10(=C13−3) is retained in the register 11-3.

For example, it is assumed that the external column address Ain corresponds to the column C7. Because of S1=2, the column (corresponding to the internal column address Ao) to be accessed becomes C7+2=C9. Then the column to be accessed is sequentially shifted.

That is, Ain=C7+1=C8 is set first. Because of S1=2, the column to be accessed becomes C8+2=C10. Then, Ain=C8+1=C9 is set. Because of S1=3, the column to be accessed becomes C9+3=C12. Then, Ain=C9+1=C10 is set. Because of S1=4, the column to be accessed becomes C10+4=C14. The similar operation is repeated. Thus, the access is obtained only to the normal column.

In the configuration of the third embodiment, the access order to the page buffer 5 is the one in FIG. 12 of the first embodiment, and the interconnection difference that should be considered with respect to the internal column address Ao is extremely decreased. The need to use the pointer is eliminated, so that the circuit scale can further be reduced compared with the first and second embodiments.

Accordingly, the semiconductor storage device 1 of the first and second embodiments comprises the memory cell array 2 that comprises a plurality of memory cells, each of the memory cells being correlated with the row and one of the columns C0 to C15, the data being able to be retained in the memory cell; the plurality of first latch circuits 22 each of which is provided while correlated with each column C, and can retain information as to whether the correlated column C is defective; the plurality of second latch circuits 23 each of which is provided while correlated with each column C, and in which a pointer can be set; and the plurality of third latch circuits 20 each of which is provided while correlated with each column C, can retain write data or read data for the correlated column C, and is activated at a time the pointer is set to the second latch circuit 23 when the correlated first latch circuit 22 retains the information indicating that the column is not defective. The pointer is sequentially shifted among the second latch circuits 23 in synchronization with the clock, and, in shifting the pointer, the pointer skips the second latch circuit 23 correlated with the first latch circuit 22 that retains the information indicating that the column is defective.

The semiconductor storage device 1 of the first embodiment further comprises the control circuit (redundancy circuit 4) that calculates a first column address Ao selecting the jth (j is an integer of 0 or more; j≧i) column based on the second column address Ain, the second column address Ain being externally input and selecting the ith (j is an integer of 0 or more) column. At this point, S1=(j−i) corresponds to the number of defective columns located between the 0th column and the jth column, and the pointer is set to the jth column correlated with the first column address Ao calculated by the control circuit 4.

Alternatively, the semiconductor storage device 1 of the second embodiment further comprises the control circuit (redundancy circuit 4) that calculates the number S1 of defective columns located between the 0th column and the jth (j is an integer of 0 or more; j≧i) column based on a first column address Ain, an ith (i is an integer of 0 or more) column being replaced with the jth column, the first column address Ain being externally input and selecting the ith column, and the plurality of decoders 24 each of which is provided while correlated with each column C, determines whether the correlated column C corresponds to the first column address Ao, and sets the pointer to the correlated second latch circuit 23 when the correlated column C corresponds to the first column address Ao. The pointer that is set to one of the second latch circuits 23 by the decoder 24 is sequentially shifted among the second latch circuits 23 by the number S1 of defective columns calculated by the control circuit 4.

Alternatively, the semiconductor storage device 1 of the third embodiment comprises the memory cell array 2 that comprises a plurality of memory cells, each of which is correlated with the row and one of the columns C0 to C15, and can retain the data; the plurality of first latch circuits 22 each of which is provided while correlated with each column C, and can retain information as to whether the correlated column C is defective; the plurality of second latch circuits 20 each of which is provided while correlated with each column C, and can retain write data or read data for the correlated column C, the control circuit (redundancy circuit 4) that calculates the second column address Ao selecting the jth (j is an integer of 0 or more; j≧i) column based on the first column address Ain, the first column address being externally input and selecting the ith (j is an integer of 0 or more) column, and the plurality of decoders 24 each of which is provided while correlated with each column C, and determines whether the correlated column C corresponds to the second column address Ao. At this point, S1=(j−i) corresponds to the number of defective columns located between the 0th column and the jth column. The second latch circuit 20 is activated when the decoder 24 determines that the correlated column C corresponds to the second column address Ao while the correlated first latch circuit 22 retains the information indicating that the column is not defective.

According to the configurations, only the latch circuit 20 for the normal column is activated. In producing the internal column address Ao, the internal column address Ao is always the address that is associated with the latch circuit 20 for the normal column. Thus, the pointer is set to the leading column to be accessed, and then the pointer is sequentially shifted. Accordingly, the region that is restricted as the redundancy column region is not required in the page buffer. Therefore, it is not necessary to perform the unnecessary data transfer (such as the data transfer from the normal column region to the redundancy column region in the page buffer and the data transfer from the latch in the redundancy control circuit to the redundancy column region in the page buffer). As a result, the operating speed of the NAND flash memory can be enhanced without increasing the chip area.

In the embodiments, the data write has been described as the data transfer operation by way of example. Obviously the similar operation can be performed in reading the data. In reading the data, the data is read to the page buffer 5 in units of page, and stored in the latch circuit 20 in units of column. Then each latch circuit 20 outputs the read data through the data line DL. At this point, from which latch circuit 20 the data is read, that is, which latch circuit 20 is activated can be determined by the method similar to that of the data write. Then, the latch circuit 20 may sequentially be activated such that the pointer is shifted as described in the first and second embodiments, and such that the internal column address Ao is sequentially produced as described in the third embodiment.

In the embodiments, by way of example, the access cannot be obtained to the column when "1" is retained in the latch circuit 22. However, irrespective of the data in the latch circuit 22, the access may be obtained to the column to which the pointer is set. This configuration is also useful to the defective column detecting operation and the like.

In another configuration, the pointer may not be forcedly set to the latch circuit 23 when "1" is set to the latch circuit 22. In this case, in FIG. 8 of the first embodiment, "1" is not set to the latch circuit 23-2, but the latch circuit 23-2 keeps "0."

In the second embodiment, the register 11 of the redundancy circuit 4 may retain the address A(CRD) of the defective column CRD. In this case, in step S12 of FIG. 15, Ain and A(CRD) are compared to each other. That is, the external column address and the column address of the defective column are compared. In step S12, the total number of A(CRD)s that satisfy A(CRD)≦Ain is set to the count number S1. In this case, in the shift in step S33, the pointer skips the latch circuit 23 associated with the column (that is, defective column) in which "1" is retained in the latch circuit 22.

For example, the operation of the latch circuit 23 in the page buffer 5 may be controlled by the control circuit 6. For example, the control circuit 6 produces a control signal. SET and supplies the control signal SET to the page buffer 5. In the case of SET="L", the latch circuit 23 captures the signal provided from the preceding selection unit 21. On the other hand, in the case of SET="H", the latch circuit 23 does not capture the output of the preceding selection unit 21, but sets the data based on an external control signal (for example, a control signal by the decoder 24).

Accordingly, when the above configuration is adopted, in the first embodiment, the pointer is set to the leading column while the control circuit 6 is set in the state of SET="H". That is, the operations illustrated in FIGS. 5 and 6 are performed. When the state of FIG. 6 is obtained, the control circuit 6 is set in the state of SET="L". As a result, the pointer is sequentially transferred among the latch circuits 23, and the operations of FIGS. 7 and 8 are performed. In the second embodiment, the operation of FIG. 14 is performed while the control circuit 6 is set in the state of SET="H". Then the control circuit 6 is set in the state of SET="L", and the operation of FIG. 15 and the pointer shift are performed.

Although the NAND flash memory has been described in the first to third embodiments by way of example, the semiconductor storage device of the embodiments may be applied to a NOR flash memory, a DINOR flash memory, and an AND flash memory. The semiconductor memory device of the embodiment can be applied not only to the flash memories but also to a general semiconductor memory such as an Magneto-resistive Random Access Memory (MRAM) in which a magneto tunneling junction element is used as the memory cell and an Resistance Random Access Memory (ReRAM) in which a variable resistive element is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array which includes memory cells associated with columns and capable of storing data;
first latch circuits associated with the columns and holding information as to whether an associated column is defective;
second latch circuits in which a pointer is set, the second latch circuits being associated with the columns; and
third latch circuits associated with the columns and holding write data or read data for an associated column, one of the third latch circuits being activated at a time the pointer is set to an associated one of the second latch circuits when an associated one of the first latch circuits holds the information indicating that the associated column is not defective,
wherein the pointer is sequentially shifted among the second latch circuits in synchronization with a clock, and
in shifting the pointer, the pointer skips one of the second latch circuits associated with one of the first latch circuits which holds the information indicating that the associated column is defective.

2. The device according to claim 1, further comprising a control circuit which calculates a first column address selecting a j-th (j is an integer of 0 or more; j≧i) column based on a second column address, the second column address being externally input and selecting an i-th (i is an integer of 0 or more) column,
wherein the value of (j−i) corresponds to the number of defective columns located between a 0-th column and the j-th column, and
the pointer is set to the j-th column corresponding to the first column address calculated by the control circuit.

3. The device according to claim 2, wherein the control circuit includes:
registers which are sequentially associated with a k-th (k is an integer of 0 or more) column which is the defective column, each of the registers holding a third column address indicating a (k−l)-th column, the variable l indicating the number of defective columns located between a 0-th column and a (k−1)-th column;
a comparator which compares the second column address with the third column address held in each of the registers; and
a calculator which calculates the first column address by setting the number of the third column addresses smaller than the first column address in the comparator to the value of (j−i).

4. The device according to claim 2, further comprising selection circuits associated with the columns, each of the selection circuits selecting one of output from an associated one of the second latch circuits and input to the associated one of the second latch circuits, and inputting the selected one to a subsequent one of the second latch circuits,
wherein each of the selection circuits selects the input when an associated one of the first latch circuits hold information indicating that the associated column is defective, and selects the output when the associated one of the first latch circuits hold information indicating that the associated column is not defective, and
each of the second latch circuits captures a signal from an associated one of the selection circuits in synchronization with the clock.

5. The device according to claim 1, further comprising:
a control circuit which calculates the number of defective columns located between a 0-th column and a j-th (j is an integer of 0 or more; j≧i) column based on a first column address, an i-th (i is an integer of 0 or more) column being replaced with the j-th column, the first column address being externally input and selecting the i-th column; and
decoders associated with the columns, each of the decoders determining whether an associated column corresponds to the first column address, and setting the pointer to an associated one of the second latch circuits when the associated column corresponds to the first column address,
wherein the pointer which is set by the decoder is sequentially shifted among the second latch circuits by the number of defective columns calculated by the control circuit.

6. The device according to claim 5, wherein the control circuit includes:

registers which are sequentially associated with a k-th (k is an integer of 0 or more) column which is the defective column, each of the registers holding a second column address indicating a (k−l)-th column, the variable l indicating the number of defective columns located between a 0-th column and a (k−1)-th column;

a comparator which compares the first column address with the second column address held in each of the registers; and a calculator which sets the number of the second column addresses smaller than the first column address in the comparator to the number of defective columns located between the 0-th column and the j-th column.

7. The device according to claim 5, further comprising selection circuits associated with the columns, each of the selection circuits selecting one of output from an associated one of the second latch circuits and input to the associated one of the second latch circuits, and inputting the selected one to a subsequent one of the second latch circuits, wherein each of the selection circuits selects the input when an associated one of the first latch circuits hold information indicating that the associated column is defective, and selects the output when the associated one of the first latch circuits hold information indicating that the associated column is not defective, and each of the second latch circuits captures a signal from an one of the associated selection circuits in synchronization with the clock.

8. A semiconductor memory device comprising:
a memory cell array which includes memory cells associated with columns and capable of storing data;

first latch circuits associated with the columns and holding information as to whether an associated column is defective;

second latch circuits associated with the columns and capable of holding write data or read data for an associated column; and a control circuit which calculates a first column address selecting a j-th (j is an integer of 0 or more; j≧i) column based on a second column address, the first column address being externally input and selecting an i-th (i is an integer of 0 or more) column; and decoders which are associated with the columns, and determine whether an associated column corresponds to the first column address, wherein the value of (j−i) corresponds to the number of defective columns located between 0-th to the j-th columns, and one of the second latch circuits is activated when an associated decoder determines that an associated column corresponds to the first column address, and an associated first latch circuit holds the information indicating that the associated column is not defective.

9. The device according to claim 8, wherein the control circuit includes:
registers which are sequentially associated with a k-th (k is an integer of 0 or more) column which is the defective column, each of the registers holding a third column address indicating a (k−l)-th column, the variable l indicating the number of defective columns located between a 0-th column and a (k−1)-th column;

a comparator which compares the second column address with the third column address held in each of the registers; and a calculator which calculates the first column address by setting the number of the third column addresses smaller than the second column address in the comparator to the value of (j−i).

10. A method for controlling a semiconductor memory device including first latch circuits associated with columns, the method comprising:

receiving a first column address which selects an i-th column;

activating one of the first latch circuits associated with a j-th (j≧i) column, in response to the first column address;

activating sequentially one of the first latch circuits while skipping a defective column; and transferring the data to an activated one of first latch circuits.

11. The method according to claim 10, wherein the device further includes second latch circuits associated with the columns, and one of the first latch circuits is activated by setting a pointer to an associated one of the second latch circuits.

12. The method according to claim 11, wherein the device further includes third latch circuits associated with the columns, and each of the third latch circuits holds information as to whether an associated one of the columns is defective.

13. The method according to claim 12, wherein the pointer is sequentially transferred among the second latch circuits from the j-th column in synchronization with a clock, and during the transfer, in one of the columns which is indicated as the defective in the information, the pointer is transferred to the subsequent one of the second latch circuits while bypassing a defective column.

14. The method according to claim 10, wherein the device further includes second latch circuits associated with the columns, and the activating one of the first latch circuits associated with a j-th column includes:
calculating the number of defective columns included between the i-th column and the j-th column;
adding the number of defective columns to the value of i to specify the j-th column; and
setting the pointer to one of the second latch circuits associated with the j-th column.

15. The method according to claim 10, wherein the device further includes second latch circuits associated with the columns, and the activating one of the first latch circuits associated with a j-th column includes:
calculating the number of defective columns included between the i-th column and the j-th column;
setting the pointer to one of the second latch circuits associated with the i-th column; and
setting the pointer to one of the second latch circuits associated with the j-th column by shifting the pointer among the columns by the number of defective columns.

16. The method according to claim 10, wherein the activating one of the first latch circuits associated with the j-th column includes:
calculating the number of defective columns included between the i-th column and the j-th column; and
adding the number of defective columns to the value of i to specify the j-th column, and
the activating sequentially one of the first latch circuits while skipping a defective column includes:
calculating the number of defective columns included between the i-th column and the j-th column, while setting the value of j to (j+1); and
adding the number of defective columns to the value of i to specify the j-th column.

* * * * *